(12) United States Patent
Johnson et al.

(10) Patent No.: US 6,441,419 B1
(45) Date of Patent: Aug. 27, 2002

(54) ENCAPSULATED-METAL VERTICAL-INTERDIGITATED CAPACITOR AND DAMASCENE METHOD OF MANUFACTURING SAME

(75) Inventors: Gregory A. Johnson; Kunal Taravade; Gayle Miller, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/525,489

(22) Filed: Mar. 15, 2000

Related U.S. Application Data

(63) Continuation-in-part of application No. 09/219,655, filed on Dec. 23, 1998, now Pat. No. 6,417,535, and a continuation-in-part of application No. 09/221,023, filed on Dec. 23, 1998, now Pat. No. 6,251,740, and a continuation-in-part of application No. 09/052,793, filed on Mar. 31, 1998, now Pat. No. 6,358,837, and a continuation-in-part of application No. 09/052,851, filed on Mar. 31, 1998, now Pat. No. 6,057,571.

(51) Int. Cl.[7] .................. H01L 27/108; H01L 29/76; H01L 29/94; H01L 31/119
(52) U.S. Cl. .................. 257/296; 257/306; 257/309
(58) Field of Search .................. 257/295–310, 257/530–535; 438/253–254, 391–399

(56) References Cited

U.S. PATENT DOCUMENTS

| | | | |
|---|---|---|---|
| 4,437,139 A | 3/1984 | Howard | |
| 4,912,535 A | 3/1990 | Okumura | |
| 5,095,346 A | 3/1992 | Bae et al. | |
| 5,101,251 A | 3/1992 | Wakamiya et al. | |
| 5,142,436 A | 8/1992 | Kammerdiner et al. | |
| 5,155,657 A | 10/1992 | Oehrlein et al. | |
| 5,187,637 A | 2/1993 | Embree | |
| 5,195,018 A | 3/1993 | Kwon et al. | |
| 5,240,871 A | 8/1993 | Doan et al. | |
| 5,273,925 A | 12/1993 | Yamanaka | |
| 5,381,365 A | 1/1995 | Ajika et al. | |
| 5,394,000 A | 2/1995 | Ellul et al. | |

(List continued on next page.)

FOREIGN PATENT DOCUMENTS

| | | |
|---|---|---|
| JP | 60253265 | 12/1985 |
| JP | 63048856 | 3/1988 |
| JP | 63087761 | 4/1988 |

OTHER PUBLICATIONS

Arjun Kar–Roy, et al., High Density Metal Insulator Metal Capacitors Using PECVD Nitride for Mixied Signal and RF Circuits, 1999 IEEE, pp. 245–247.

Peter Van Zant, Microchip Fabrication—A Practical Guide to Semiconductor Processing, Third Edition, pp. 374 and 379.

*Primary Examiner*—Tom Thomas
*Assistant Examiner*—Cuong Quang Nguyen
(74) *Attorney, Agent, or Firm*—John R. Ley, LLC

(57) ABSTRACT

An integrated circuit includes a vertical-interdigitated capacitor located between an upper interconnect layer and a lower interconnect layer. Both interconnect layers include conductors formed of a metal capable of atom diffusion or ion migration, such as copper. The capacitor plates contact an interconnect layer conductor to create barrier layers to prevent atom diffusion or ion migration from the conductors at the contact locations. Additional barrier layers contact the conductors at locations other than where the capacitor plate portions contact the conductors, and the additional barrier layers are preferably formed of the same material and at the same time that one of the plates is formed. The integrated circuit may include a via plug interconnect extending between conductors of upper and lower interconnect layers, with a plug barrier layer surrounding the plug material to prevent atom diffusion or ion migration from the plug material.

20 Claims, 10 Drawing Sheets

U.S. PATENT DOCUMENTS

| | | |
|---|---|---|
| 5,434,812 A | 7/1995 | Tseng |
| 5,436,186 A | 7/1995 | Hsue et al. |
| 5,451,551 A | 9/1995 | Krishnan et al. |
| 5,479,316 A | 12/1995 | Smrtic et al. |
| 5,494,854 A | 2/1996 | Jain |
| 5,494,857 A | 2/1996 | Cooperman et al. |
| 5,497,017 A | 3/1996 | Gonzales |
| 5,605,857 A | 2/1997 | Jost et al. |
| 5,654,581 A | 8/1997 | Radosevich et al. |
| 5,702,990 A | 12/1997 | Jost et al. |
| 5,708,303 A | 1/1998 | Jeng |
| 5,736,457 A | 4/1998 | Zhao |
| 5,739,579 A | 4/1998 | Chiang et al. |
| 5,742,471 A | 4/1998 | Barbee, Jr. et al. |
| 5,747,382 A | 5/1998 | Huang et al. |
| 5,753,948 A | 5/1998 | Nguyen et al. |
| 5,767,541 A | 6/1998 | Hanagasaki |
| 5,846,876 A | 12/1998 | Bandyopadhyay et al. |
| 5,913,141 A | 6/1999 | Bothra |
| 5,915,203 A | 6/1999 | Sengupta et al. |
| 5,925,932 A | 7/1999 | Tran et al. |
| 5,926,359 A | 7/1999 | Greco et al. |
| 5,976,928 A * | 11/1999 | Kirlin et al. ............... 438/396 |
| 5,981,374 A | 11/1999 | Dalal et al. |
| 6,004,839 A | 12/1999 | Hayashi et al. |
| 6,025,226 A | 2/2000 | Gambino et al. |
| 6,057,571 A * | 5/2000 | Miller et al. ............... 257/296 |
| 6,069,051 A | 5/2000 | Nguyen et al. |
| 6,081,021 A * | 6/2000 | Gambino et al. ........... 257/530 |
| 6,100,155 A * | 8/2000 | Hu ............................. 438/253 |
| 6,180,976 B1 * | 1/2001 | Roy ............................ 257/306 |
| 6,197,650 B1 | 3/2001 | Wu |
| 6,728,172 | 8/2001 | Tominaga |

\* cited by examiner

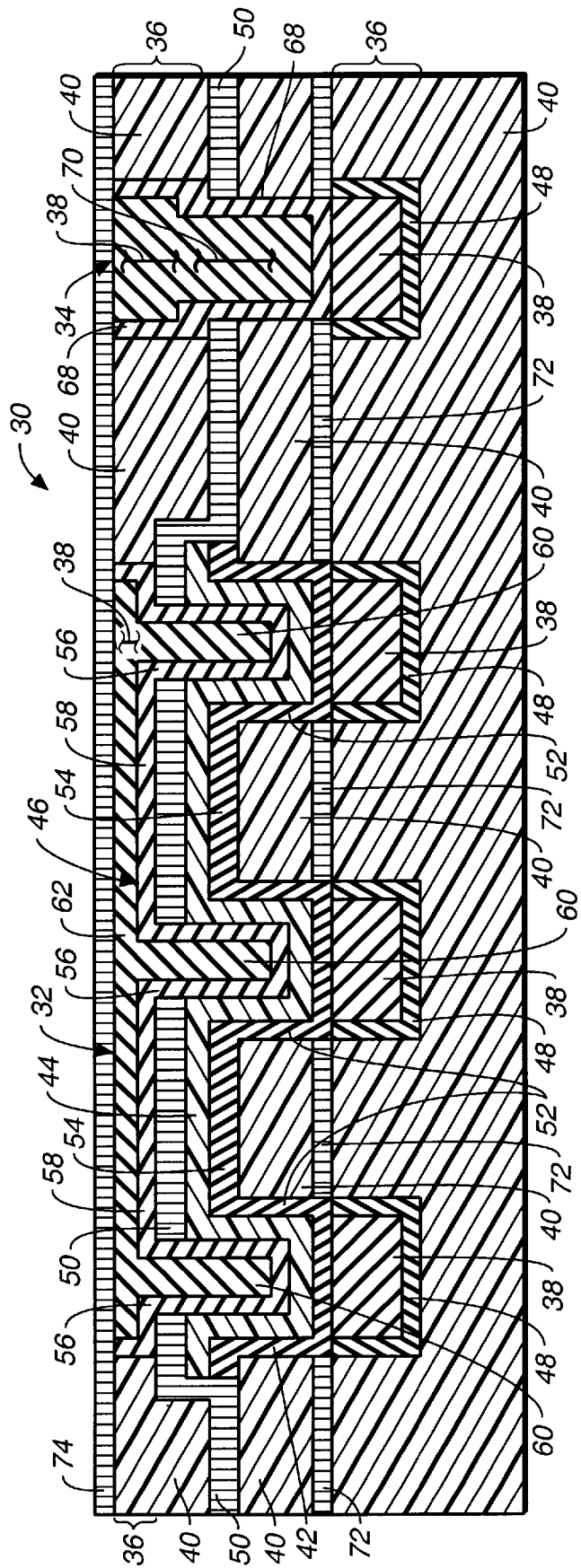
FIG._1

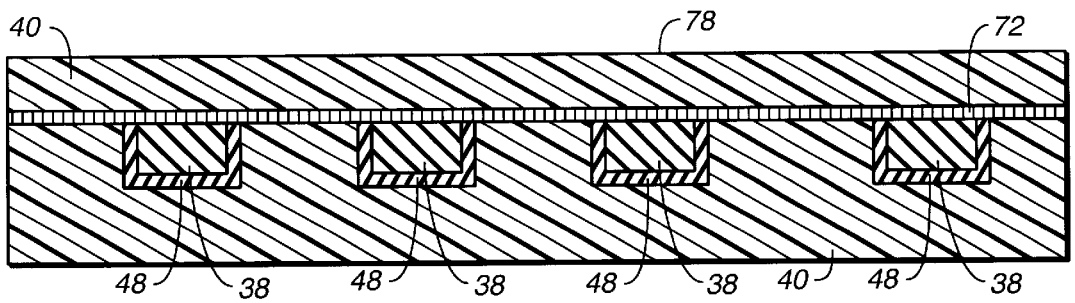
FIG._2
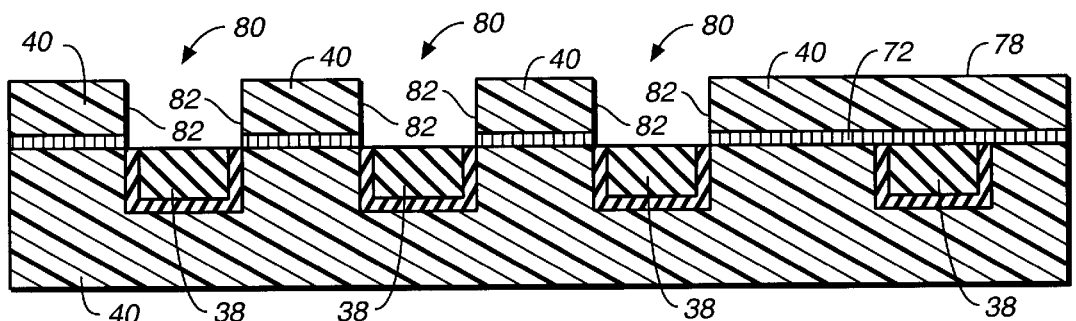
FIG._3
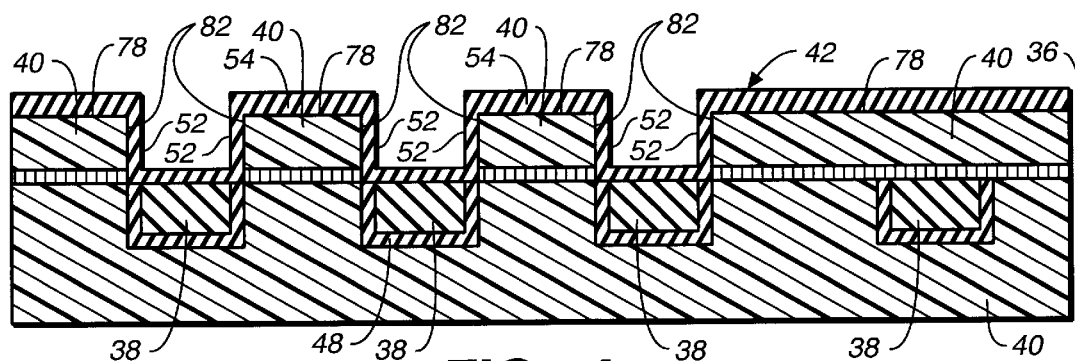
FIG._4
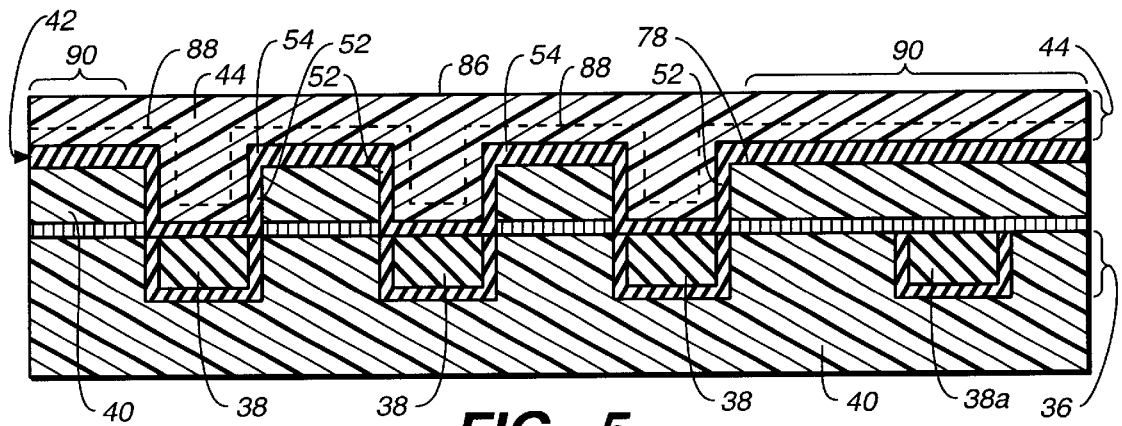
FIG._5

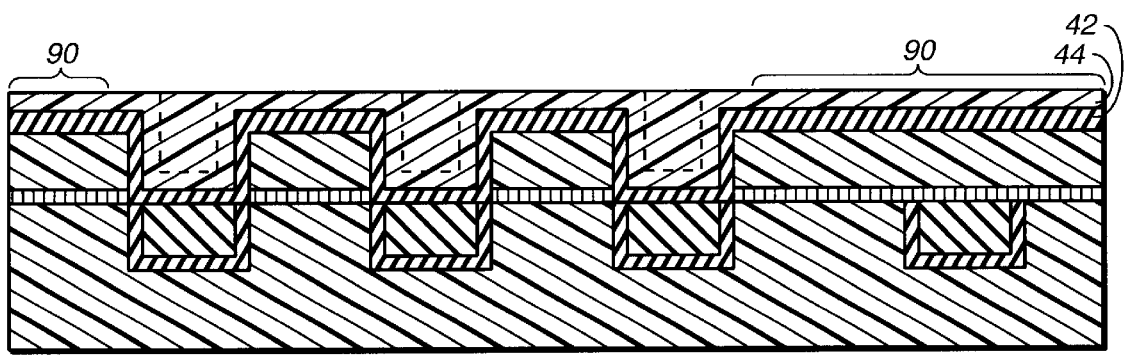
FIG._6A
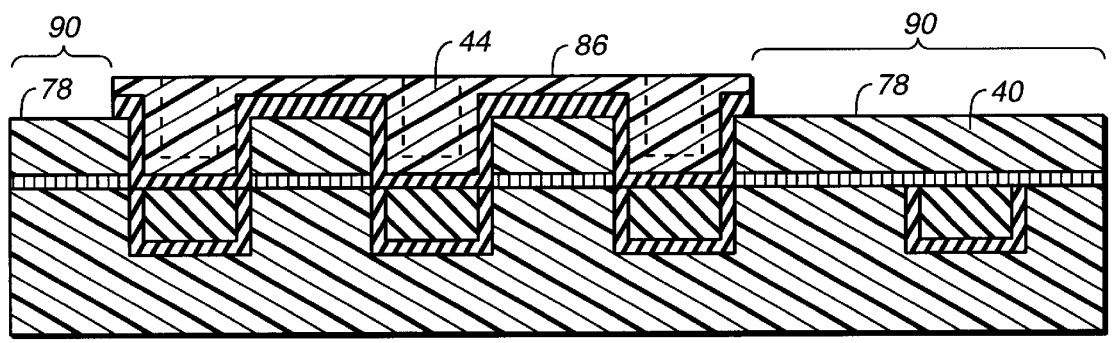
FIG._6B
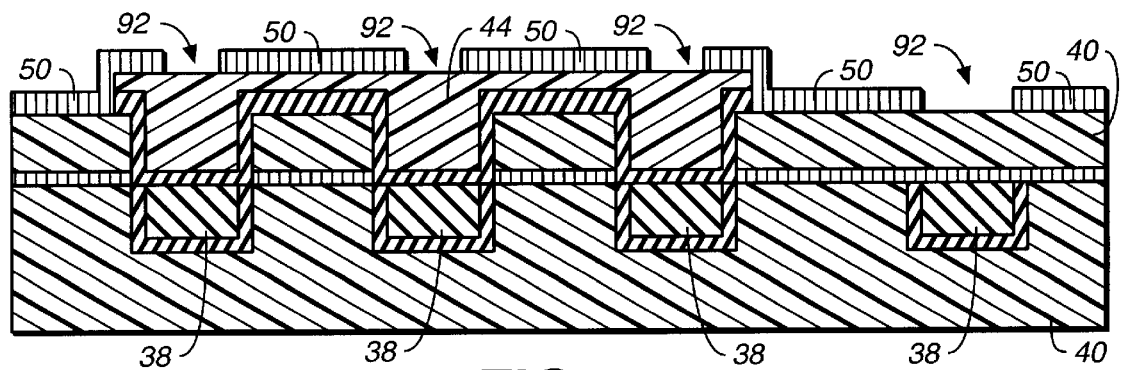
FIG._7

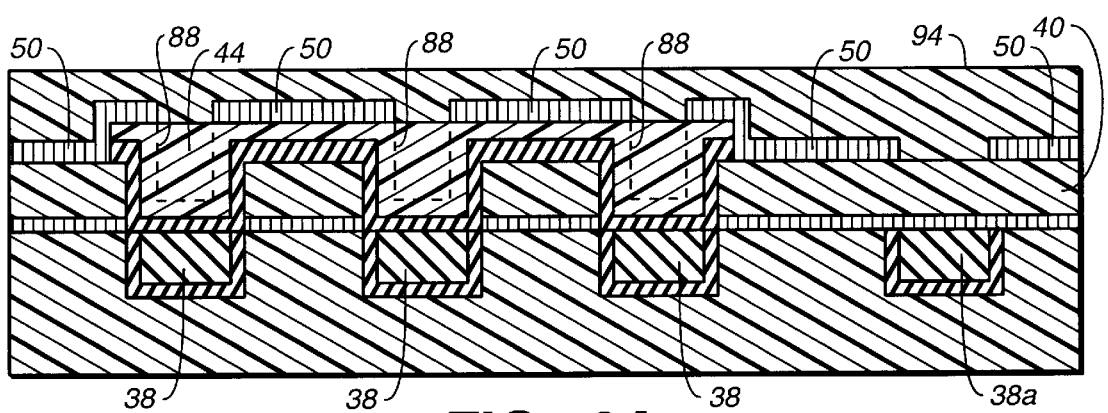
FIG._8A
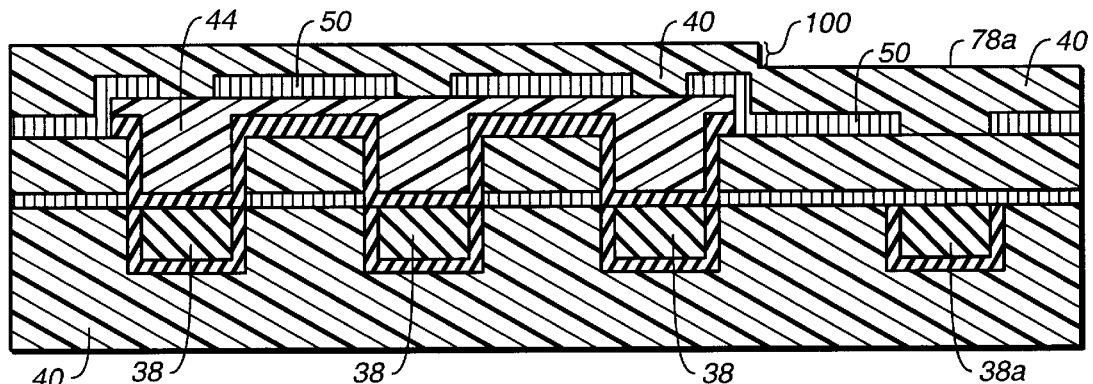
FIG._8B
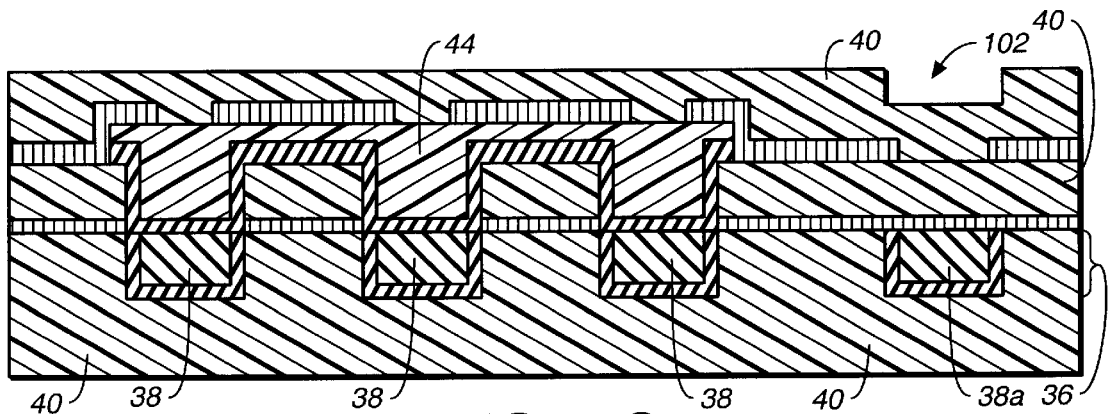
FIG._8C

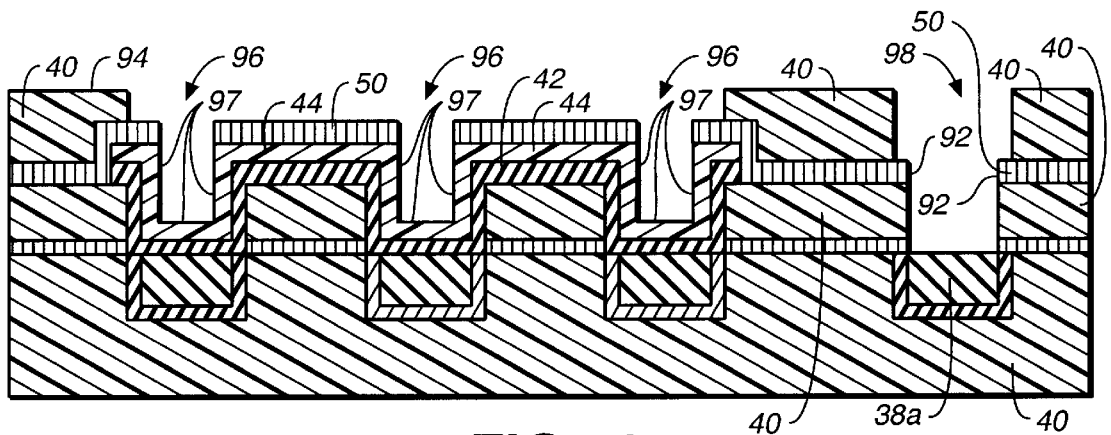
FIG._9
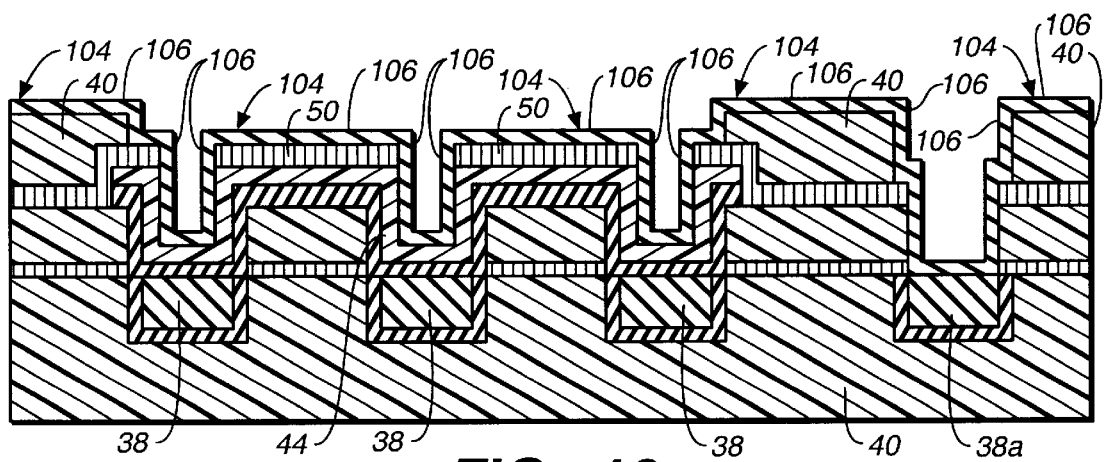
FIG._10

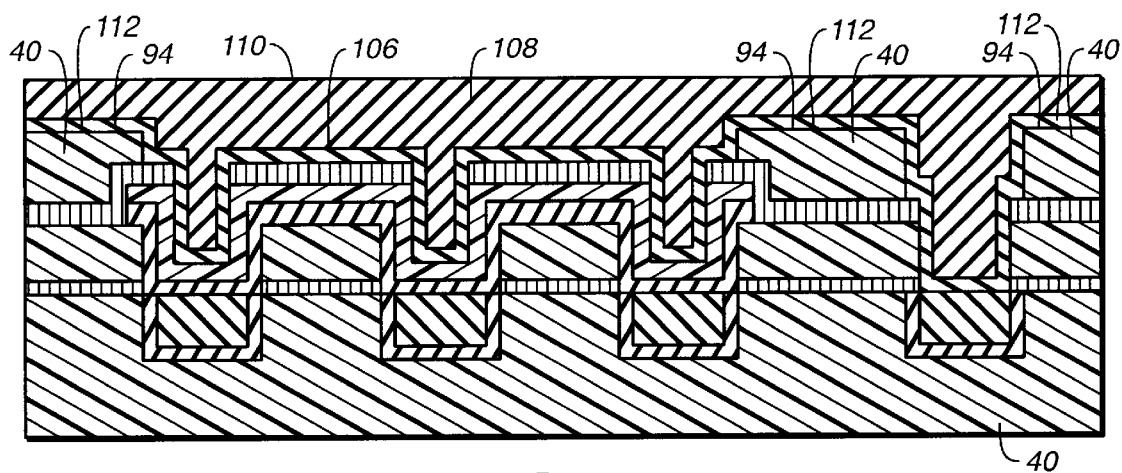
FIG._11
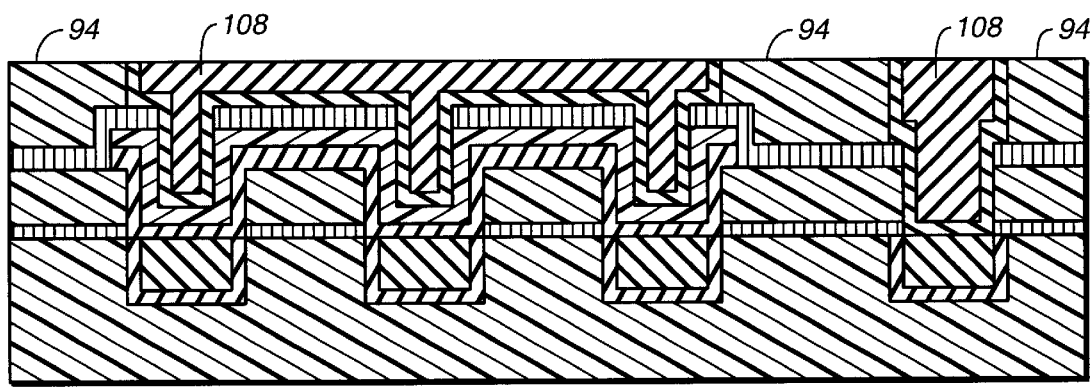
FIG._12

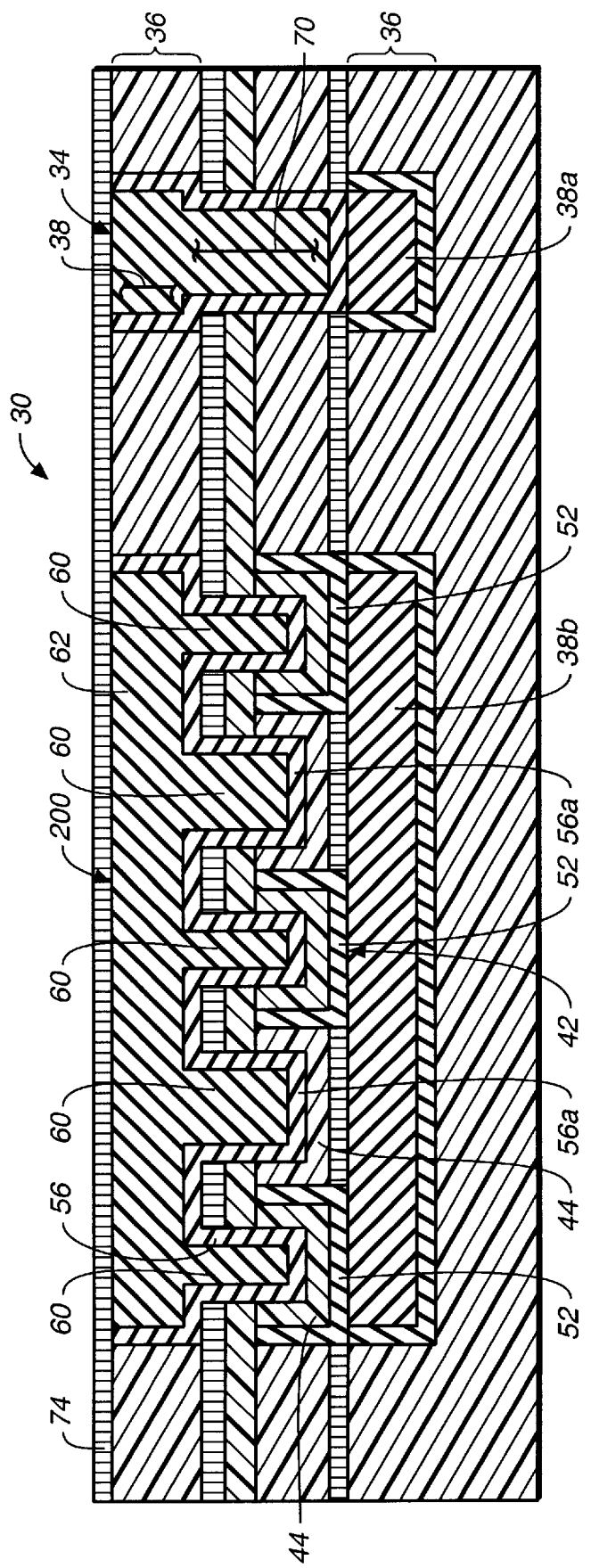
FIG._13

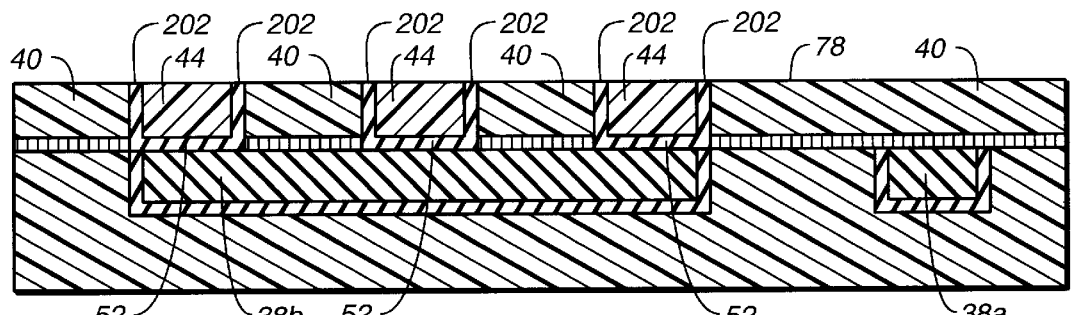
FIG._14A
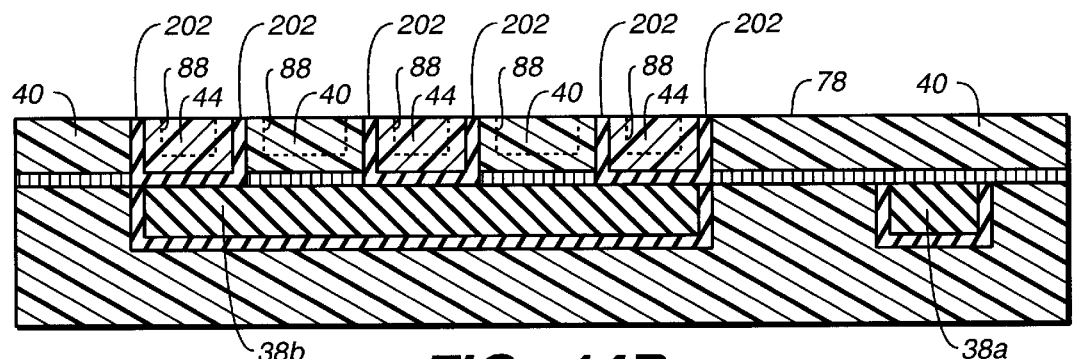
FIG._14B
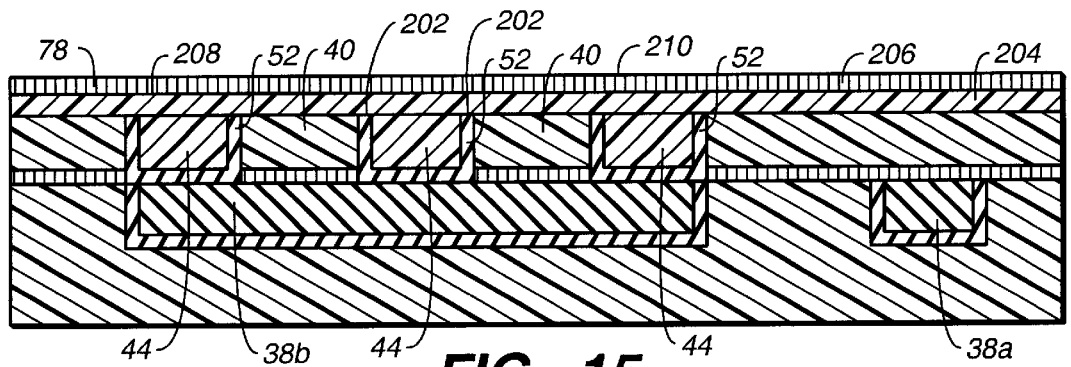
FIG._15

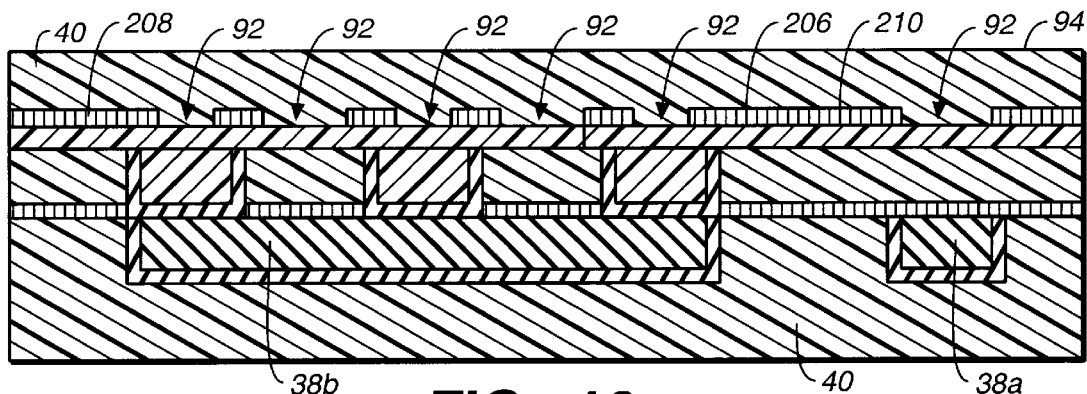
*FIG._16*
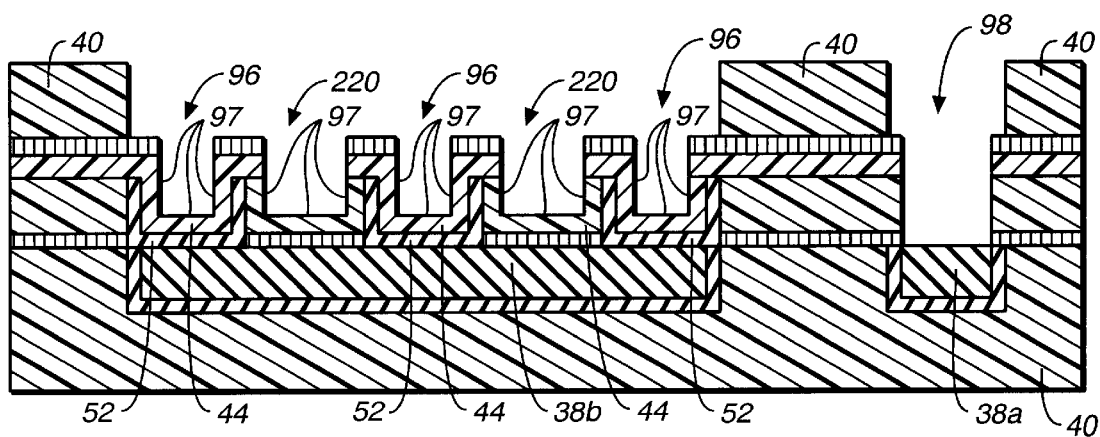
*FIG._17*

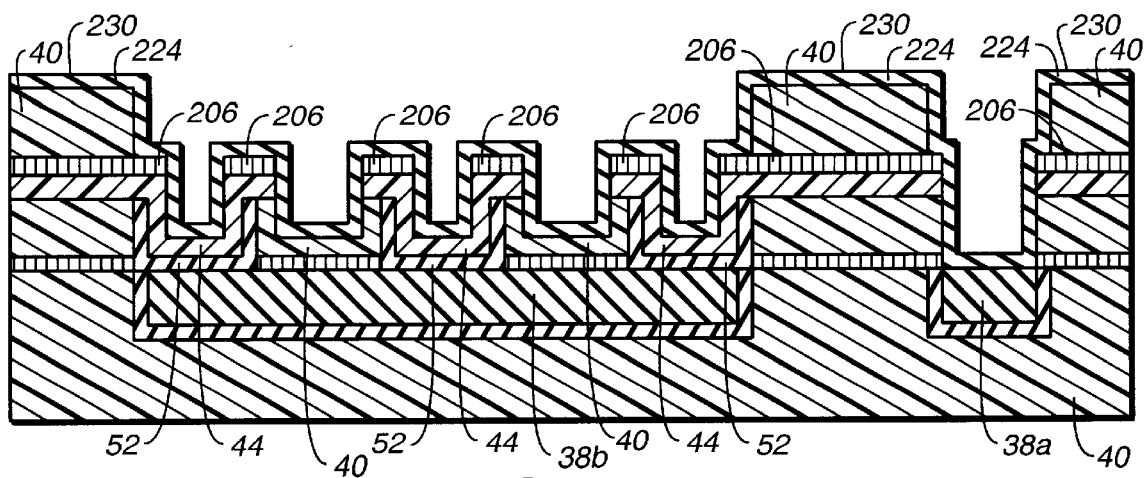
FIG._18
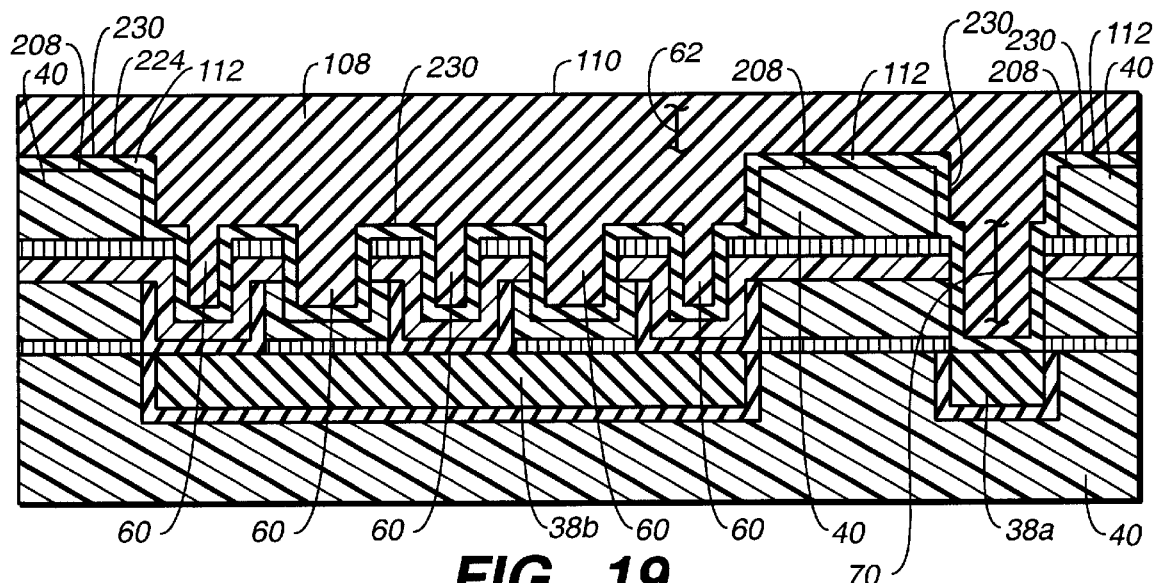
FIG._19
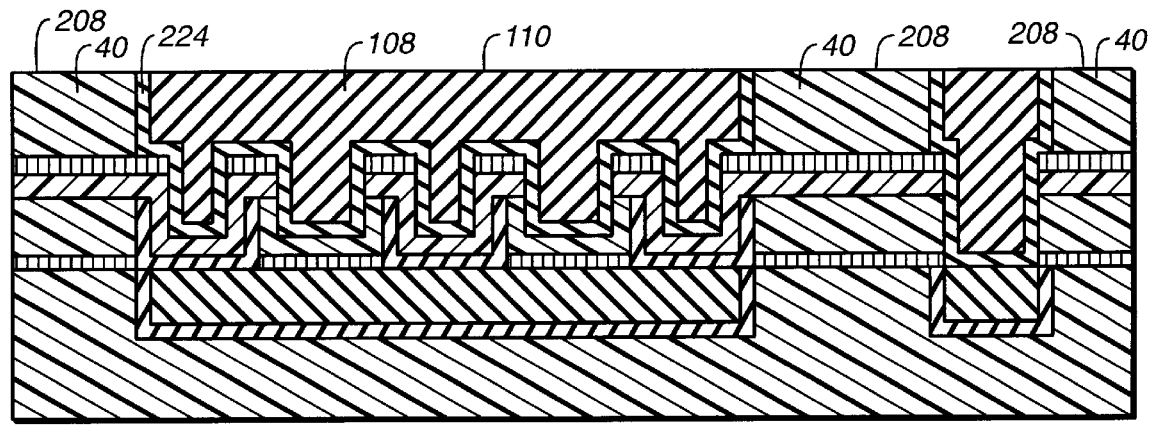
FIG._20

ENCAPSULATED-METAL VERTICAL-INTERDIGITATED CAPACITOR AND DAMASCENE METHOD OF MANUFACTURING SAME

CROSS-REFERENCE TO RELATED INVENTION

This is a continuation-in-part of U.S. patent application Ser. No. 09/219,655 titled "Vertical Interdigitated Metal-Insulator-Metal Capacitor for an Integrated Circuit," filed Dec. 23, 1998 now U.S. Pat. No. 6,417,535 by two of the present inventors; Ser. No. 09/221,023 titled "Process for Fabricating Vertical Interdigitated Metal-Insulator-Metal Structure Within an Integrated Circuit," filed Dec. 23, 1998 now U.S. Pat. No. 6,251,740 by two of the present inventors; Ser. No. 09/052,793 titled "Method of Electrically Connecting and Isolating Components with Vertical Elements Extending Between Interconnect Layers in an Integrated Circuit", filed Mar. 31, 1998 now U.S. Pat. No. 6,358,837 by one of the present inventors; and Ser. No. 09/052,851 titled "High Aspect Ratio, Metal-To-Metal Linear Capacitor for an Integrated Circuit," filed Mar. 31, 1998 now U.S. Pat. No. 6,057,571 by one of the present inventors. All of the aforementioned U.S. patent applications are assigned to the assignee hereof. The subject matter of the aforementioned U.S. patent applications is incorporated herein by this reference.

FIELD OF THE INVENTION

This invention relates to capacitors formed in integrated circuits (ICs). More particularly, the present invention relates to a new and improved encapsulated metal vertical interdigitated capacitor located between interconnect layers of an IC, and a damascene method of making the same. The capacitor construction allows highly conductive metal, such as copper, to be used as conductors in the interconnect layers and to contact the plates of the capacitor while deterring metal atom diffusion or metal ion migration which may occur under elevated temperature conditions or biasing conditions and to prohibit and to prevent adverse effects from such migration, among other things. The damascene method of manufacturing the capacitor avoids difficult-to-execute etching steps which would otherwise be required to fabricate the capacitor and the IC while simultaneously avoiding residual accumulations of material in openings following chemical mechanical polishing steps required to form the multiple interconnect layers, among other things.

BACKGROUND OF THE INVENTION

Modern integrated circuits (ICs) are frequently constructed using multiple layers or levels of electrical conductors formed above a substrate into which the functional devices of the IC are formed. Each level of electrical conductors is referred to as an "interconnect layer." Multiple interconnect layers are advantageous in ICs because valuable substrate space is not excessively consumed by the electrical connections between the various components. Instead, the electrical conductors of each interconnect layer route the signals between many of the functional components in the substrate. The ability to construct ICs with multiple interconnect layers has come about as a result of planarization techniques such as chemical mechanical polishing (CMP).

In addition to routing the electrical signals by conductors outside the substrate, the interconnect layers have also been employed for additional beneficial functions, such as the incorporation of capacitors in interlayer dielectric (ILD) insulating material which separates the electrical conductors of the vertically separated interconnect layers, and the incorporation of capacitors with the conductors of the interconnect layers themselves. The above referenced U.S. patent applications all pertain to the incorporation of capacitors with the interconnect layers and to a technique for vertically orienting portions of the capacitor plates between the interconnect layers to maximize the amount of capacitance obtained relative to the horizontal surface area consumed.

The first two above referenced U.S. patent applications, "Vertically Interdigitated Metal-Insulator-Metal Capacitor for an Integrated Circuit" and "Process for Fabricating Vertical Interdigitated Metal-Insulator-Metal Structure within an Integrated Circuit" describe a capacitor structure and fabrication process which has the advantage of forming vertical plate capacitors between the interconnect layers using CMP process steps when openings in the structure are not present, thereby avoiding the accumulation of residual slurry material from the CMP process and resist material from the subsequent photolithographic process in the openings. Residual slurry material accumulated in the openings creates subsequent fabrication difficulties and defects in the resulting IC. For example, residual photoresist will outgas when metal is applied over it. The outgas effect prevents the metal from depositing properly, if at all. Inadequately deposited metal may result in open or unreliable circuit connections, thereby degrading the functionality of the IC or capacitor. Residual materials are extremely difficult to remove completely from the opening, and attempts to do so add additional process steps and may even raise the risk that the other existing circuit components will be damaged by the cleaning process itself.

The two applications mentioned in the preceding paragraph describe the inventions in the context of conventional aluminum electrical conductors in the interconnect layers and tungsten filling openings adjoining the upper capacitor plates and in via plug interconnects extending between the interconnect layers. Aluminum is typically used as a major component of the interconnect layer conductors because aluminum is relatively easily formed into desired conductor patterns by use of conventional photolithographic patterning and etching techniques. Etching aluminum can be effectively accomplished in a relatively low temperature environment. The low temperature environment does not introduce adverse influences on the other components of the IC. For example, relatively high temperatures may cause metal conductors to expand and deform, or the relatively high temperatures may cause metal grain growth which deforms the structure. Such adverse influences may destroy the components or reduce their functionality. Tungsten is used as the fill material for similar reasons and because of its compatibility with materials typically used in semiconductor processing.

Ideally, it would be more advantageous to use copper rather than aluminum for the conductors in the interconnect layer or tungsten as the fill material in the vias. Copper is more conductive than aluminum, thus allowing for less signal attenuation, smaller signal propagation delays and higher operating frequencies in the IC circuitry. However, plasma etching of copper in semiconductor fabrication requires a much higher temperature than the temperature required to plasma etch aluminum, thus causing the aforementioned temperature-induced adversities. At the present time there are no known cost-effective plasma etching techniques suitable for copper. Furthermore, atoms or ions of copper from copper conductors may diffuse or migrate throughout the insulating and other materials on the IC, including the substrate, and destroy the effectiveness of the functional devices and the insulators.

While it is known to encapsulate copper conductors in barrier metal to prevent or substantially inhibit the migration of the copper ions and the diffusion of copper atoms throughout the IC structure, such encapsulation techniques involve additional process steps and add complexity to the overall IC fabrication.

It is with regard to these and other considerations that the present invention has evolved.

SUMMARY OF THE INVENTION

One aspect of this invention relates to a relatively high capacity capacitor formed between interconnect layers which uses copper or other high conductivity metal conductors or metals capable of atom diffusion or ion migration in a manner in which capacitor plates serve as barrier metal to prevent the atom diffusion and migration of copper ions from high conductivity metal conductors throughout the IC. A related aspect of this invention relates to using barrier metal to at least partially encapsulate the high conductivity or copper conductors of the interconnect layers as well as a capacitor plate, thereby simplifying the IC construction by not requiring a full complement of separate steps to encapsulate the high conductivity or copper conductors. Another aspect of this invention relates to a capacitor construction and fabrication process in which the elements of the capacitor are formed by damascene processes and chemical metal polishing (CMP) processes, thereby avoiding the necessity to etch the copper or other high conductivity metal of the interconnect layer conductors and also avoiding the problems created from high temperature etching. A further aspect of this invention utilizes CMP and other planarization processes during the formation of the capacitor when openings are present, to continue to obtain the advantages of avoiding the accumulation of residual slurry materials in openings and of avoiding the necessity of additional cleaning steps during the IC fabrication process. Still a further aspect of this invention pertains to forming via plug interconnects between the conductors of the interconnect layers using the same high conductivity material of the interconnect layer conductors conjunctively with the formation of the capacitor while preventing metal atom diffusion and metal ion migration.

In accordance with these and other aspects, the present invention relates to an integrated circuit having an upper interconnect layer and a lower interconnect layer in which each interconnect layer comprises a conductor formed of a metal capable of atom diffusion or ion migration, such as copper. An improved capacitor is located between the upper and lower interconnect layers. The capacitor comprises upper and lower capacitor plates with capacitor dielectric material separating the plates. The lower plate has a portion contacting a conductor positioned within the lower interconnect layer and the upper plate has a portion contacting a conductor positioned within the upper interconnect layer. The portions of the upper and lower plates which contact the conductors form plate barrier layers to prevent atom diffusion and ion migration from the conductors at the contact locations.

Additionally, the present invention relates to a method of fabricating an integrated circuit (IC) having upper and lower interconnect layers between which a capacitor is located. The method comprising the steps of forming conductors in the interconnect layers of a metal capable of atom diffusion or ion migration within the IC, forming upper and lower capacitor plates having portions in contact with the conductors of the upper and lower interconnect layers, respectively, and forming the upper and lower capacitor plates of barrier metal to prevent atom diffusion and ion migration into the IC from the conductors at the locations contacted by the capacitor plate portions.

Additional preferred features of both the apparatus and method aspects of the invention relate to forming additional barrier layers contacting the conductors at locations other than where the capacitor plate portions contact the conductors to prevent atom diffusion and ion migration from the conductors at the other locations. The additional barrier layers are preferably formed of the same material as the material from which one of the plates is formed. In addition, the integrated circuit may include a via plug interconnect extending between conductors of the upper and lower interconnect layers, with a plug barrier layer surrounding the plug material to prevent atom diffusion and ion migration from the plug material. The plates of the capacitor may be oriented vertically to obtain maximum capacitance from a minimum amount of horizontal surface area. Preferably the capacitor plates are formed in U-shaped configurations. A finger portion of the interconnect layer conductor may project into the U-shaped portion of the upper capacitor plate. In addition, an additional finger portion of the interconnect layer conductor may project into a space adjoining the U-shaped lower capacitor plate to increase the amount of capacitance obtained.

A more complete appreciation of the present invention and its improvements can be obtained by reference to the accompanying drawings, which are briefly summarized below, to the following detailed description of presently preferred embodiments of the invention, and to the appended claims.

BRIEF DESCRIPTION OF THE DRAWINGS

FIG. 1 is a partial, vertical cross-sectional view of an integrated circuit having an encapsulated-metal, vertical-interdigitated metal-insulator-metal capacitor extending between interconnect layers which incorporates the present invention, as well as via plug interconnect extending between the interconnect layers.

FIGS. 2–12 are cross-sectional views showing a sequence of steps involved in fabricating the capacitor, via plug interconnect and interconnect layer conductors shown in FIG. 1, according to the present invention, with FIGS. 6A and 6B and FIGS. 8A, 8B, and 8C showing alternative process steps at an intermediate stage of the sequence.

FIG. 13 is a partial, vertical cross-sectional view of a second embodiment of an encapsulated-metal, vertical-interdigitated metal-insulator metal capacitor extending between interconnect layers which also incorporates the present invention, as well as a via plug interconnect.

FIGS. 14A, 14B, and 15–20 are cross-sectional views showing the sequence of steps involved in fabricating the capacitor, via plug interconnect and interconnect layer conductors shown in FIG. 13, according to the present invention, with FIGS. 14A and 14B showing alternative process steps at an intermediate stage of the sequence.

DETAILED DESCRIPTION

A portion of an IC 30 incorporating an encapsulated-metal, vertical-interdigitated, metal-insulator-metal capacitor structure 32 of the present invention is shown in FIG. 1.

Also shown is an encapsulated-metal via plug interconnect structure 34 which also constitutes an aspect of the present invention. The IC 30 is of the type having multiple interconnect layers 36 of electrical conductors 38 separated by interlayer dielectric (ILD) insulating material 40. The interconnect layers 36 are formed on top of one another, separated by the ILD material 40, and on top of a substrate (not shown) in which the majority of the active devices such as transistors, of the IC 30 are formed.

The conductors 38 of each interconnect layer 36 establish electrical connections between the active devices in the substrate and other conductors 38 of other interconnect layers 36. The material of the conductors 38 is a high conductivity metal, preferably copper, having an encapsulating barrier surrounding the conductors 38 to prevent atom diffusion or ion migration throughout the IC.

The via plug interconnects 34 extend the electrical connections in a vertical dimension (as shown) between the conductors 38 of the vertically spaced interconnect layers 36 and the substrate. The ILD material 40 electrically insulates the conductors 38, whether the conductors 38 are in the same interconnect layer 36 or in vertically-spaced interconnect layers. The conductors 38 of one interconnect layer may be slightly higher or lower than other conductors 38 of that same layer 36. In other words, the conductors 38 of each layer 36 need not be exactly coplanar. Consequently, the interlayer dielectric material 40 may vary in thickness between conductors 38 of adjacent interconnect layers 36 resulting in some relatively thick areas of interlayer dielectric 40. In addition, in those locations of the IC 30 where conductors 38 of interconnect layers 36 are not vertically adjacent, the interlayer dielectric 40 may extend continuously vertically for the dimension of two or more interconnect layers 36.

The capacitor 32 is formed in the ILD material 40 between vertically adjacent interconnect layers 36. The capacitor 32 comprises an undulating lower metal plate 42, an undulating capacitor dielectric material 44 and an undulating upper plate 46 which is separated from the lower plate 42 by the capacitor dielectric material 44. The plates 42 and 46 and the capacitor dielectric material 44 generally extend in parallel relationship, or in uniformly spaced relationship, with one another, thereby forming a generally parallel plate capacitor configuration. The lower plate 42 electrically contacts at least one conductor 38 in a relatively lower interconnect layer 36 while the upper plate 46 electrically contacts a conductor 38 located in a relatively upper interconnect layer 36. The capacitor dielectric material 44 completely separates the two plates 42 and 46. The lower plate 42, capacitor dielectric material 44 and upper plate 46 are electrically connected within the IC 30 in the conventional manner so that the upper plate 46 and the lower plate 42 develop a relative differential in electrical charge.

The undulating lower plate 42 is formed by the continuous connection of a plurality of lower plate U-shaped portions 52 and lower plate horizontal portions 54. Each lower plate horizontal portion 54 extends across the top surface of the ILD material 40 and connects to an adjacent U-shaped portion 52. As shown in FIG. 1, two lower plate horizontal portions 54 connect three lower plate U-shaped portions 52. At least one of the lower plate U-shaped portions 52 contacts one of the conductors 38 of the lower interconnect layer 36.

The bottom plate 42 is preferably formed of barrier metal, such as tantalum, tantalum nitride, titanium nitride or molybdenum, which prevents or substantially inhibits the diffusion of atoms or the migration of ions from the copper conductors 38 of the lower interconnect layer 36. Alternatively, the bottom plate may be formed as two separate layers, such as a first lower layer (shown) of tantalum followed by a second upper layer (not shown) of tantalum nitride.

The formation of the lower capacitor plate 42 with its U-shaped portions 52 also serves to form part of and complete the metal barrier which surrounds the copper conductor 38 of the relatively lower interconnect layer 36, thereby simplifying the process of encapsulating the copper conductor 38 in barrier metal to prevent atom diffusion or ion migration. In other words, the formation of the lower capacitor plate 42 also accomplishes partial encapsulation of the lower copper conductor 38.

The capacitor dielectric 44 is also undulating in shape and separates the upper and lower plates 42 and 46 and may be made of ILD material 40, or a specific capacitor dielectric material. The above referenced U.S. patent applications describe different types of capacitor dielectric materials which may be advantageously incorporated in the capacitor 32. In addition, a mid level barrier layer 50, typically made of silicon nitride or silicon oxynitride, is principally located between the lower plate horizontal portion 54 and the upper plate horizontal portion 58. The mid level barrier layer 50 also extends horizontally throughout the IC 30, as shown in FIG. 1. This mid level barrier layer 50 is used for dual damascene via formation, and is not, per se, a required element of the capacitor 32.

The undulating upper plate 46 is formed by the continuous connection of a plurality of upper plate U-shaped portions 56 and upper plate horizontal portions 58. Each upper plate horizontal portion 58 extends across the top surface of the mid level barrier layer 50 and connects to an adjacent U-shaped portion 56. The two upper plate horizontal portions 58 connect three upper plate U-shaped portions 56. Occupying the interior of the upper U-shaped portions are three fingers 60 formed by a metal fill or plug material. Preferably, the three metal fingers 60 are integral extensions of the conductor 38 of the interconnect layer. Consequently, the three metal fingers 60 are high conductivity metal, preferably copper. Vertically above the upper capacitor plate 46, the conductor 38 of the interconnect layer 36 extends in a connection segment 62 which has a sufficient width to allow the three fingers 60 to extend downwardly from it. These copper fingers 60 provide a mechanical and electrical connection between the upper U-shaped plate portions 56 and the horizontal copper connection segment 62. The lower surface of the horizontal copper connection segment 62 is also in mechanical and electrical connection with the upper surface of the upper plate horizontal portions 58.

The upper plate portions 56 and 58 are preferably formed of barrier metal, which prevents or substantially impedes the diffusion of atoms or the migration of ions from the copper fingers 60 and connection segment 62. Thus, the formation of the upper capacitor plate 46 with its U-shaped portions 56 and horizontal portions 58 also serves to form part of the metal barrier which surrounds the portions 60 and 62 of the copper conductor 38 of the relatively upper interconnect layer 36, thereby simplifying the process of encapsulating the conductors 38 in barrier metal to prevent atom diffusion and ion migration. The formation of the upper capacitor plate 46 also accomplishes partial encapsulation of the copper conductors 38 of the upper interconnect layer 36.

The capacitance of the capacitor 32 depends on the relative surface areas of the plates 42 and 46, and the thickness and properties of the capacitor dielectric material 44, among other things. The capacitor 32 comprises several portions, each contributing its own capacitance. Since the capacitor dielectric material 44 is continuous and completely separates the generally parallel upper and lower plates 46 and 42, the separate capacitor portions can be considered as separate capacitors connected together. The U-shaped portions 52 and 56, and the horizontal portions 54 and 58 of the lower and upper plates, 42 and 46 respectively, form a plurality of parallel plate capacitor portions. Vertical-oriented parallel plate capacitor portions are formed by the vertical sections (as shown) of the U-shaped portions 52 and 56 of the lower and upper plates 42 and 46. Horizontal-oriented parallel plate capacitor portions are formed by the horizontal portions 54 and 58 (as shown) of the lower and upper plates 42 and 46. Consequently, the capacitance of the capacitor structure 32 is the sum of the capacitances of its various portions.

The via plug interconnect 34 comprises a U-shaped layer or liner 68 of metal formed within the dielectric 40. The U-shaped liner 68 of metal directly contacts, and thus forms an electrical connection with, the conductor 38 of the relatively lower interconnect layer 36. Metal fill or plug material 70 is positioned within the U-shaped liner 68. The plug material 70 is high conductivity metal, preferably copper. The plug material 70 is in mechanical and electrical connection with the U-shaped liner 68. The U-shaped liner 68 and the plug material 70 directly contact the conductor 38 of the relatively upper interconnect layer 36, thus forming an electrical connection between the relatively upper and relatively lower interconnect conductors 38.

The U-shaped liner 68 of the via plug interconnect 34 is preferably formed at the same time as, and is preferably of the same barrier material as, the upper plate portions 56 and 58. As such, the U-shaped liner 68 prevents or substantially inhibits the diffusion of atoms and the migration of ions from the copper plug material 70 and from the conductor 38 from which the plug material 70 extends. Since the U-shaped liner 68 is formed simultaneously with the upper capacitor plate 46, no additional process steps are required to form the metal barrier which surrounds the copper plug material 70 and the conductor 38 from which it extends, thereby simplifying the process of encapsulating the copper in a barrier metal to prevent or inhibit atom diffusion and ion migration. Forming the upper capacitor plate 46 also simultaneously partially encapsulates the conductors 38 and plug material 70 of the via plug interconnects 34.

A lower level barrier layer 72 extends generally between the ILD layers at the level of the top surface of the lower interconnect layer 36. The lower level barrier layer 72 is preferably constructed of silicon nitride or silicon oxynitride. The barrier layer 72 serves as a barrier for atom diffusion or ion migration from the upper surface of the conductors 38 of the relatively lower interconnect layer 36 at those locations (not shown) where the lower plate 42 does not contact the conductors 38 or where via plug interconnects 34 are not formed. In other locations, the lower level barrier layer 72 is a remnant of the manufacturing process and is not, per se, a or functional element.

An upper level barrier layer 74 is also preferably constructed of silicon nitride or silicon oxynitride. The upper level barrier layer 74 serves as a cap or barrier to atom diffusion and ion migration from the conductor 38 at locations above the via 34 and for the copper connection segment 62 of the capacitor 32, as well as in other locations (not shown) which are not contacted by part of a capacitor 32 or a via plug interconnect 34. In other locations and like the lower level barrier layer 72, the upper level barrier layer 74 is a remnant of the manufacturing process and is not, per se, a required or functional element.

The upper and lower level barrier layers 72 and 74, the upper capacitor plate 46, the U-shaped via plug liner 68, and the lower capacitor plate 42 fully encapsulate the copper conductors 38 of the interconnect layers 36 to prevent copper atom diffusion or ion migration throughout the IC. Since the upper and lower capacitor plates 46 and 42 must be formed to create the capacitor 32, and because the U-shaped liner 68 for the via plug interconnect 34 may be formed simultaneously with the top capacitor plate 46, the copper conductors 38 of the interconnect layers may be fully encapsulated by the additional steps of forming only the upper and lower level barrier layers 74 and 72, respectively. Consequently, by using the upper and lower capacitor plates as partial barrier layers to the copper conductors, as well as the via plug interconnect liner which is relatively simply formed simultaneously with the upper capacitor plate, the copper encapsulation procedures in fabricating the IC 30 are substantially simplified.

The capacitor structure 32 shown in FIG. 1 achieves many advantages over known capacitors. The capacitor 32 is advantageously placed between the interconnect layers 36 and has a higher capacitance than known capacitors since it comprises both vertical and horizontal parallel plate capacitor portions that are combined. The capacitor structure 32 can be formed at the same time using the same materials and process steps as those used to form the via interconnect 34 and to encapsulate the copper conductors of the interconnect layers. Moreover, as will be apparent from the following discussion, the formation of the capacitor structure 32 does not involve etching the copper conductors of the interconnect layers or the use of chemical mechanical polishing steps while openings are present, either of which could result in manufacturing problems. The use of copper in the via 34 and the capacitor 32 structures allows for less signal attenuation, smaller signal propagation delays and higher operating frequencies in the IC circuitry because of the use of the highly conductive metal for the conductors 38 of the interconnect layers 36.

The process steps to fabricate the encapsulated-metal, vertical interdigitated capacitor 32 and via plug interconnect 34 begin at the stage shown in FIG. 2 where the conductors 38 of the lower interconnect layer 36 have been formed within the ILD material 40. The barrier layers 48 are formed in openings created by plasma etching in the ILD material 40. The barrier layers 48 are preferably made of tantalum and/or tantalum nitride, or titanium nitride, or molybdenum. The conductors 38 are formed using conventional damascene deposition techniques, and thereafter the upper surfaces of the barrier layers 48 and the conductors 38 are planarized using conventional CMP techniques. The conductors 38 are preferably made of copper. The lower barrier layer 72 is thereafter deposited and an additional layer of ILD material 40 is deposited on top of the lower barrier layer 72. The ILD material 40 is preferably formed using plasma-enhanced chemical vapor deposition (PECVD) or chemical vapor deposition (CVD). The upper surface 78 of the ILD material 40 is typically uneven. Consequently, following deposition of the material 40, a CMP process step is preferably used to smooth the upper surface 78.

Following the deposition of the interlayer dielectric 40, capacitor vias 80 are formed as shown in FIG. 3. Essentially, the vias 80 are holes in the interlayer dielectric 40 that have substantially vertical side walls 82 extending from the upper surface 78 of the dielectric material 40 down through the lower barrier layer 72 to the upper surface of the conductors 38. The vias 80 in the interlayer dielectric 40 are preferably formed by conventional lithographic and etching steps.

Preferably the vias 80 are etched by a conventional reactive ion etching process or a plasma etching process. The etching proceeds very directionally without substantial isotropic deviation. The metal interconnect conductors 38 are exposed at the lower ends of the vias 80. After the vias 80 have been completed as shown in FIG. 3, photoresist material (not shown) which was previously placed on upper surface 78 and used to protect the ILD material 40 during etching is removed. Although the via plug interconnect 34 (FIG. 1) is created by first forming a via, the via for the via plug interconnect 34 is not created simultaneously with the capacitor vias 80.

The lower capacitor plate 42 is next formed in the capacitor vias 80 and on the upper surface 78 of the interlayer dielectric material 40, as shown in FIG. 4. The metal capacitor plate 42 is formed on the side walls 82 of the vias 80, on the lower conductor 38 exposed at the lower end of the vias 80 and on the top surface 78 of the interlayer dielectric material 40, preferably by sputtering, CVD, PECVD or other physical vapor deposition techniques. The deposition process is self-aligning and thus forms the lower metal plate 42 of essentially uniform thickness.

Preferably, the metal from which the lower plate 42 is formed is made of layers of tantalum, tantalum nitride, titanium nitride, or molybdenum. metals will adhere to the ILD material 40, and the copper of the conductors 38, and will form a barrier which will inhibit atom diffusion or ion migration from the copper conductors 38 into the ILD material 40. Forming the lower plate 42 with the same process and material as the metal barrier layer 48 of the conductors 38 of the interconnect layers 36 greatly simplifies the IC fabrication process because no different process steps are required beyond those necessary to form the metal barrier layers 48. Thus, no additional complexity in the IC fabrication process is introduced. The reliability of the IC fabrication process is also preserved because of the fewer number of separate processing steps which must be accomplished. If desired or for specific purposes, the metal from which the lower plate 42 is formed may be different from the metal(s) of the metal barrier layers 48 of the interconnect layers 36.

Once the lower metal plate 42 is formed, capacitor dielectric material 44 is deposited over the metal plate 42, as shown in FIG. 5. The capacitor dielectric material 44 covers the entire surface of the lower plate 42, occupies the open interior within a U-shaped portion 52 of the capacitor plate 42, and covers upper horizontal portions 54 of the capacitor plate 42 formed on top of the ILD material 40. Depositing the capacitor dielectric material 44 upon these surfaces simplifies the process, because other processing steps are not required to isolate or expose these surfaces. Preferably, PECVD or CVD is used to form the capacitor dielectric material 44. The PECVD or CVD process continues until the space within the U-shaped portions 52 of the lower plate 42 are filled and an upper surface 86 of the capacitor dielectric material 44 is formed. The upper surface 86 of the dielectric material 40 may not be even, and a CMP step is preferably used to level the top surface 86.

Preferably, at a predetermined time in the capacitor dielectric deposition process, an etch-stop layer 88 is formed in the capacitor dielectric material 44 during deposition of the capacitor dielectric material 44. The etch-stop layer 88 is created by adjusting the capacitor dielectric deposition chemistry, changing the chemical characteristics of the dielectric material 44. After the etch-stop layer 88 is formed, the capacitor dielectric deposition chemistry reverts back to its original state, and capacitor dielectric material 44 having the same chemical makeup as that deposited before the etch-stop layer 88 continues until completion of the deposition of the dielectric material 44. The resulting etch-stop layer 88 is a very thin, uniform layer embedded within the capacitor dielectric material 44.

Since the lower plate 42 and the capacitor dielectric 44 are formed on the surface 78 of interlayer dielectric material 40 in areas where metal and dielectric may not be desired, e.g. in areas 90 as shown in FIG. 5, this material must be removed. First, a conventional CMP step is used to remove excess dielectric material and planarize the upper surface 86, as shown in FIG. 6A. Next, selective portions of both the capacitor dielectric material 44 and the lower plate 42 are uniformly removed using conventional photolithographic patterning and etch steps, as shown in FIG. 6B. The photolithographic and etch steps expose the upper surface 78 of the interlayer dielectric material 40.

As shown in FIG. 7, the mid level barrier layer 50 is next deposited over surfaces 78 and 86. Photoresist (not shown) is placed over the barrier layer 50 and photolithographically patterned. Openings 92 are etched in the mid level barrier layer 50, as have been previously photolithographically defined, followed by removal of the photoresist.

A layer of dielectric material 40 is then deposited over the mid level barrier layer 50 and a CMP step is preferably used to level the top surface 94 of the dielectric material 40, as shown in FIG. 8A.

Three capacitor upper plate openings 96 and a via 98 for a via plug interconnect 34 (FIG. 1) are then etched in the ILD material 40 as shown in FIG. 9. The photolithographic and etch steps used to create the openings 96 and the via 98 are similar to those used to create the vias 80 (FIG. 3). The etching of the openings 96 and the via 98 proceeds very directionally without isotropic deviation. The etch extends downward from the upper surface 94 of the dielectric material 40, into the ILD and capacitor dielectric materials 40 and 44, respectively.

An anisotropic etch process extends the via 98 down through the opening 92 in the mid level barrier 50 to the lower copper conductor 38a as shown in FIG. 9, exposing the upper surface of the copper conductor 38a at the lower end of the via 98. The via 98 is etched to ensure that the lower copper interconnect conductor 38a is sufficiently clear and exposed.

The etching of the capacitor upper plate openings 96 proceeds downward until reaching the etch-stop layer 88 (FIG. 8A). Since the etch-stop layer 88 (FIG. 8A) is a different chemical composition it resists further etching and thus effectively prevents the openings 96 from reaching down to the lower plate 42. The location of the etch-stop layer 88 thus defines the thickness of the capacitor dielectric 44.

If the etch-stop layer 88 (FIG. 8A) is not used, then the etching of the upper capacitor plate openings 96 must be stopped at a predetermined time before the capacitor dielectric material 44 has been removed down to the lower plate 42. Stopping the etch process before exposing the lower plate 42 ensures that a layer of capacitor dielectric material 44 remains above a lower horizontal portion of the U-shaped portion of the lower plate 42 and establishes the thickness of the capacitor dielectric material 44 which contributes to establishing the capacitance value of the capacitor.

Because the etch process forms the via 98 for the via plug interconnect simultaneously with openings 96, it is important to coordinate the depth of the ILD material 40 above the interconnect conductor 38a relative to the depth to which the upper plate openings 96 will be formed. If too much ILD material exists above the interconnect conductor 38a such that stopping the etch process to satisfy the depth requirements of the openings 96 does not sufficiently expose the interconnect conductor 38a, the via 98 will not be adequately formed.

To coordinate the height of ILD material 40 above the conductor 38a relative to the depth of the openings 96, a surface 78a of the ILD material 40 above the lower conductor 38a may be reduced in height by a predetermined distance 100, as shown in FIG. 8B. Lowering the surface 78a by the distance 100 is achieved by additional photolithographic patterning and etching steps. The distance 100 by which the surface 78 is lowered depends on the relative depth relationship of the upper plate openings 96 and the via 98 (FIG. 9), as explained. Consequently, when the via 98 is etched simultaneously with the openings 96, the via 98 etching process proceeds sufficiently downward and through the opening 92 in the mid level barrier layer 50 to reach and expose the conductor 38a as shown in FIG. 9 when the openings 96 are formed or before the openings 96 reach their bottom level. The technique described in conjunction with FIG. 8B is primarily useful when the etch stop layer (FIG. 8A) is not incorporated into the capacitor dielectric material 44.

Another alternative for forming the vias, which does not use the etch stop layer 88 (FIG. 8A), or the lowering of surface 78a using photolithographic patterning and etching steps (FIG. 8B), involves using two sequential photolithographic patterning and etching steps, as is illustrated in FIG. 8C. Under these circumstances, the first etch step partially etches the via by forming an opening 102 as shown in FIG. 8C. While the opening 102 is being formed, the capacitor and interlayer dielectric materials 44 and 40, respectively, are protected with photoresist (not shown). Thereafter, a second photolithographic/etch step is used to form the openings 96 (FIG. 9) and complete the via 98. While the openings 96 are etched, the remainder of the via 98 is simultaneously etched from the opening 102 (FIG. 8C), exposing the lower interconnect 38a, resulting in the configuration shown in FIG. 9. Since the via 98 was partially formed in the step shown in FIG. 8C, the second completing etch step, shown in FIG. 9, can be stopped at a time when the resulting upper plate openings 96 reach a desired depth simultaneously with or after the via 98 reaches the conductor 38a.

A further alternative method of forming the openings 96 and the via 98 involves a photolithographic patterning and etching step to completely etch either the openings 96 or the via 98, and thereafter using another separate photolithographic patterning and etching step to completely etch the other of the via 98 or the openings 96 while the first completed openings or via are protected. This method requires the removal of the resist protective material from the previously formed openings after the second etch process is completed, and therefore this last alternative method may not be preferred because it may leave residual materials in the openings which are difficult or impossible to remove.

After deposition of the capacitor dielectric material 44, a hydrogen and/or nitrogen alloy process step may be employed to densify the capacitor dielectric material 44 to improve or stabilize the material and electrical properties of the capacitor dielectric material 44. This hydrogen and/or nitrogen alloy process step may be applied after the forming of the openings 96 as shown in FIG. 9, to the exposed surfaces 97 of the capacitor dielectric material 44.

Following the formation of the openings 96 and the via 98, the process flow continues as shown in FIG. 10. A layer 104 of metal, which eventually forms the upper capacitor plate 46 (FIG. 1) and the barrier layer 68 (FIG. 1) for the via plug interconnect 34 is next deposited on top of the ILD material 40, the mid level barrier layer 50, and the capacitor dielectric 44. The metal layer 104 partially fills the interior of the upper plate openings 96 and the via 98 (FIG. 9). The exposed surfaces of the dielectric materials 40 and 44 and the mid level barrier layer 50 are used as a self-aligning surface for the deposition of the metal layer 104. As a result, the metal layer 104 coats the interior walls and lower surface of the openings 96 and the via 98 and extends across the exposed upper surfaces of the barrier layer 50 as shown in FIG. 10. The metal layer 104 is preferably formed by sputtering, PECVD, CVD, or other physical vapor deposition techniques.

The metal layer 104 is relatively uniform, having a substantially equal thickness throughout. Preferably, the metal of the layer 104 is of at least some of the same type of metal from which the lower plate 42 is formed. Forming the metal layer 104 with the same process and substance as the lower plate 42 greatly simplifies the process because no different process steps are required. Thus, no additional complexity in the fabrication process is introduced.

The metal layer 104 is preferably formed of tantalum, tantalum nitride, titanium nitride, or molybdenum. Alternatively, the metal layer 104 may be formed as two separate layers such as a first lower layer (shown) of tantalum followed by a second upper layer (not shown) layer of tantalum nitride. A tantalum component in the metal layer 104 will assure good adherence to the ILD and capacitor dielectric materials 40 and 44, the material of the mid level barrier 50, the copper of lower conductor 38a, and to the copper which will be later deposited in contact with the metal layer 104.

The entire upper surface 106 of the metal layer 104 including the open interior spaces within the U-shaped portions of the metal layer 104 are next lined with a thin copper seed layer (not shown). The copper seed layer is deposited on the metal layer 104 using conventional deposition techniques, such as sputtering. The copper seed layer coats the upper surface of the metal layer 104 and serves as a surface for adhering the copper which is subsequently electrolytically deposited on the metal layer 104.

Copper fill material 108 is next deposited on and bonded to the copper seed layer, as shown in FIG. 11. The copper fill material 108 is deposited using conventional electrolytic techniques. The copper fill material 108 fills the U-shaped portions of the metal layer 104, forming the three copper fingers 60, the copper connection segment 62 and copper plug material 70 (FIG. 1), and covering the entire upper surface 106 of the metal layer 104 with copper fill material 108.

Next, as shown in FIG. 12, the upper surface 110 of the copper fill material 108 and the horizontal portions 112 of the metal layer 104 (FIG. 11) are then simultaneously reduced to a coplanar level with an upper surface 94 of the interlayer dielectric 40. Preferably, the removal of these materials is done using a conventional planarization technique, such as CMP.

Thereafter, the upper level barrier material 74 is deposited uniformly along the upper surface 94 of the dielectric material 40, the capacitor 32, and the via plug interconnect 34, as shown in FIG. 1. Additional layers 36 of interconnect conductors, capacitors 32, and via plug interconnects 34 may be formed in the same manner described to complete the IC 30.

After the fabrication of the active and passive circuit elements (e.g. transistors, capacitors, and interconnects) of the IC 30 has been completed, an alloy process is typically performed to stabilize the electrical properties of the various circuit elements. This alloy process is typically performed in an ambient of hydrogen and or nitrogen gas at an elevated temperature, typically between 350 and 600 degrees Celsius. This alloy process fabrication step can be done at any time after the devices of the circuit have been built, but is typically done after the IC 30 final passivation layer is deposited and photolithographically patterned/etched.

As is apparent from the fabrication process described in FIGS. 2–12, only damascene and CMP processes are used to complete the capacitor, in addition to the opening lithographic and etching steps. No CMP process is applied when any openings exist which could accumulate residual slurry materials. Furthermore, no copper plasma etching techniques are employed to form any of the conductors, because those conductors too are formed using damascene techniques. As a result, the IC and its components are not subjected to relatively elevated temperatures which could cause a detrimental effect on the IC and its components.

Another embodiment of the capacitor of the present invention is shown at 200 in FIG. 13. The capacitor 200 is similar to the capacitor 32 shown in FIG. 1, except that the capacitor 200 adds additional upper plate portions 56a to achieve an even greater capacitance with respect to the existing number and size of lower U-shaped plates portions 52. Also, FIG. 13 illustrates that the lower level conductor 38 which contacts the U-shaped portions of the lower capacitor plate 42 may constitutes one continuous integral individual conductor segment 38b rather than the three separate conductors shown in FIGS. 1–12. The single continuous conductor segment 38b, as shown in FIG. 13, could also be employed in the capacitor 32, shown in FIG. 1.

The additional plate portions 56a are positioned in horizontal spaces existing between the horizontally spaced individual lower U-shaped plate portions 52, and between the vertically extending portions of the lower plate 52. The additional plate portions 56a are contacted by and filled with the copper fingers 60 of the copper conductor segment 62, as are the other upper plate portions 56. Capacitor dielectric material 44 completely separates the lower plate portions 52 from the additional upper plate portions 56a.

The additional upper plate portions 56a interact with the horizontally-adjacent and vertically extending legs of the lower plate U-shaped portions 52 to create a charge differential horizontally between each other, just as the vertical like portions of the upper and lower plate U-shaped portions 56 and 52 interact with each other. The additional upper plate portions 56a increase the capacitance available from the capacitor 200 compared to the capacitor 32 (FIG. 1), because the capacitor 32 does not include any portions of the upper plate adjacent to the vertical legs of the lower U-shaped portions 52 in the spaces between the horizontally spaced lower U-shaped portions 52.

The via plug interconnect 34 may be incorporated with the capacitor 200 shown in FIG. 13 in a manner similar to the incorporation of the via plug interconnect and capacitor 32 shown in FIG. 1. However, in the embodiment shown in FIG. 13, the capacitor dielectric material 44 extends over to the via plug interconnects 34. The extension of the capacitor dielectric material 44 in this regard is of no significant consequence to the operation of the IC, because the capacitor dielectric material 44 is suitable as ILD material.

The capacitor 200 is formed starting with the same process steps described above with respect to FIGS. 2–5. Beginning with the configuration shown in FIG. 5, CMP is used to remove the capacitor dielectric material 44 and the horizontal portions 54 of the layer of metal forming the undulating lower plate 42, leaving the structure shown in FIG. 14A. The CMP creates a planar upper level surface 78 on the interlayer dielectric material 40. The CMP creates the separate U-shaped lower plate portions 52 having upper edges 202 which are flush with the surface 78.

Next, as shown in FIG. 15, a layer 204 of dielectric material is deposited on the upper level surface 78. The material of the layer 204 may be interlayer dielectric material 40, capacitor dielectric material 44 or some other isolation-type dielectric material. Layer 204 of dielectric material covers the upper edges 202 of the U-shaped plate portions 52. A mid level barrier layer 206 is then deposited on the upper surface 208 of the dielectric layer 204.

Next, as shown in FIG. 16, openings 92 are then etched in the barrier layer 206 using conventional photolithographic patterning and etching techniques. A layer of ILD material 40 is then deposited over the upper surface 210 of the etched barrier layer 206 and fills the openings 92. A CMP step is preferably used to level the top surface 94 of the dielectric material 40.

After the layer of ILD material 40 has been deposited on the upper surface 210, conventional photolithographic patterning and etching steps are applied, similar to the steps described above in connection with FIG. 9, to create the upper plate openings 96, the via 98 for the via plug interconnect, and openings 220 (FIG. 17) for the additional upper plate portions 56a (FIG. 13).

The etching process used to form the openings 220 (FIG. 17) is controlled to ensure that the desired amount of capacitor dielectric material 44 separates the lower portion of the additional upper plate portions 56a (FIG. 13) from the metal of the connect segment 38b (FIG. 13), thereby helping to establish additional capacitance between the upper plate portions 56a and the lower connection segment 38b.

Controlling the depth of the openings 96 and 220 relative to opening 98 (FIG. 17) can be achieved in several ways. One method involves forming the openings 96 and 220 using one photolithographic patterning and etching step, and forming opening 98 with a separate photolithographic patterning and etching step.

Another method for controlling the depth of the openings 96 and 220 relative to opening 98 involves using a photolithographic/etch step to remove a predetermined amount of material from the upper surface 94 of interlayer dielectric material 40 above the via interconnect lower-level conductor 38 (FIG. 16) in a manner similar to that described above with respect to FIGS. 8B or 8C. Another photolithographicletch step is then performed to form the openings 96, 98, and 220 simultaneously.

Finally, another method for controlling the depth of the openings 96 and 220 relative to opening 98 involves forming an etch stop layer 88 in the capacitor dielectric material 44 and in the dielectric material 40 located between the lower plate portions 52, as shown in FIG. 14B. In this method, an etch stop layer 88 is first formed in the capacitor dielectric material 44 in the manner described above with respect to FIG. 5. A thin dielectric layer (not shown) is then preferably deposited over the upper surface 78, covering the dielectric material 40, the capacitor dielectric material 44, and the upper ends 202 of the U-shaped portions 52. A photolithographic/etch step is then used to remove substantially all of the dielectric material 40 located between the lower plate portions 52. The dielectric material 40 located between the lower plate portions 52 is then redeposited with an etch stop layer 88 formed in the material 40, in a similar manner to that described above with respect to FIG. 5. A CMP process step is then used to remove excess dielectric material from the upper surface 78. Preferably, the CMP process step exposes the upper ends 202 of the U-shaped portions 52. The dielectric layer 204 and barrier layer 206 are then formed as previously described with respect to FIG. 15. A photolithographic/etch step may then be used to etch all openings 96, 98, and 220 (FIG. 17) simultaneously. The etch stop layer 88 will prevent over-etching of openings 96 and 220, so that the timing of the etch process can be defined by the time needed to completely etch the via 98.

After deposition of the capacitor dielectric material 44, a hydrogen and/or nitrogen alloy process step may be employed to densify the capacitor dielectric material 44 to improve or stabilize the material and electrical properties of the capacitor dielectric material 44. This hydrogen and/or nitrogen alloy process step may be applied after the forming of the openings 96 and 220 as shown in FIG. 17, to the exposed surfaces 97 of the capacitor dielectric material 44 and the interlayer dielectric material 40.

Once the openings 96, 98, and 220 are formed, a metal barrier layer 224 is deposited in the openings 96, 98, and 220, as shown in FIG. 18. The metal layer 224 is deposited on the surfaces of the capacitor dielectric material 44, the barrier layer 206, the interlayer dielectric material 40, and on the copper conductor 38 located at the bottom of opening 98. The deposition of the metal layer 224 is performed similarly to the deposition of the metal layer 106 described above in conjunction with FIG. 10, using one or two layers, preferably by sputtering, PECVD, CVD, or some other physical vapor deposition technique. Substantial uniformity in thickness of the metal layer 224 results. The metal of the layer 224 is preferably the same type of metal used in the lower U-shaped plate portions 52 of the capacitor.

The upper surface 230 of the metal layer 224 including the open interior spaces within the U-shaped portions of the metal layer 224 are filled with a thin copper seed layer (not shown) which coats the upper surface 230 of the metal layer 224, as discussed above with respect to FIG. 11. A copper fill material 108 is then electrolytically deposited and bonded to the copper seed layer, as shown in FIG. 19. The copper fill material 108 is deposited over the surface 230 of the metal layer 224, filling the U-shaped portions of the metal layer 224, forming the five copper fingers 60, the copper connection segment 62 and copper plug material 70 (FIG. 13), and covering the entire upper surface 230 of the metal layer 224 with copper fill material 108.

The upper surface 110 of the copper fill 108 and the horizontal portions 112 of the metal layer 224 are then simultaneously reduced to a coplanar level with an upper surface 208 of the interlayer dielectric 40, as shown in FIG. 20. Preferably, the removal of these materials is done using a conventional planarization technique, such as CMP.

Thereafter, the upper level barrier material 74 is deposited uniformly above the capacitor 200 and via plug interconnect 34 as shown in FIG. 13. Additional layers 36 of interconnect conductors and capacitor structures 200 and via plug interconnect structures 34 may be formed in the same manner described to complete the IC 30.

After the fabrication of the active and passive circuit elements (e.g. transistors, capacitors, and interconnects) of the IC 30 has been completed, an alloy process is typically performed to stabilize the electrical properties of the various circuit elements. This alloy process is typically performed in an ambient of hydrogen and or nitrogen gas at an elevated temperature, typically between 350 and 600 degrees Celsius. This alloy process fabrication step can be done at any time after the devices of the circuit have been built, but is typically done after the IC 30 final passivation layer is deposited and photolithographically patterned/etched.

Again, it is apparent from the fabrication process described in FIGS. 14–20, that only damascene and CMP processes are used to complete the capacitor, in addition to the opening etching steps. No CMP process is applied when any openings exist which could accumulate residual slurry materials. Furthermore, no copper plasma etching techniques are employed to form any of the conductors, because those conductors too are formed using damascene techniques. The IC and its components are not subjected to relatively elevated temperatures which could cause a detrimental effect on the IC and its components.

The capacitors 32 and 200 may be formed in a variety of different configurations and shapes, such as trench capacitors, cylindrical capacitors and a combination of both. Furthermore the various capacitor configurations can be organized into different plan layout patterns. The various different configurations and shapes and plan layout arrangements are discussed more completely in the two previous U.S. patent applications of which this is a continuation-in-part.

The capacitor 32 and 200, and the damascene and CMP method of fabricating them, offer significant advantages and improvements as have been described above. Relatively high conductivity material which is prone to atom diffusion or ion migration, such as copper, may be used as conductors in the interconnect layers without additional complexity in the fabrication process since a significant portion of the encapsulation occurs as a result of the capacitor plates which contact those conductors. The advantages of additional capacitance and reduced volume consumption within the IC are achieved by the vertical interdigitated configuration of the capacitors. The damascene and planarization techniques avoid the potentially damaging effect on the IC components resulting from high-temperature copper etching. The benefits of not performing CMP while openings exist are also retained. Many other advantages and improvements will be apparent after a full appreciation of the present invention has been gained.

Presently preferred embodiments of the present invention have been shown and described with a degree of particularity. These descriptions are of preferred examples of the invention. In distinction to its preferred examples, it should be understood that the scope of the present invention is defined by the scope of the following claims, which should not necessarily be limited to the detailed description of the preferred embodiments set forth above.

The invention claimed is:

1. In an integrated circuit (IC) having upper interconnect layer and a lower interconnect layer in which each interconnect layer comprises a conductor formed of a metal capable of atom diffusion or ion migration, an improved capacitor located between the upper and lower interconnect layers comprising:

upper and lower capacitor plates;

capacitor dielectric material separating the plates;

the upper plate includes a plurality of U-shaped portions;

the lower plate includes a plurality of U-shaped portions which extend generally parallel to the U-shaped portions of the upper plate;

each U-shaped portion includes a pair of leg portions connected at a base portion;

the lower plate having a portion directly contacting a conductor positioned within the lower interconnect layer;

the upper plate having a portion directly contacting a conductor positioned within the upper interconnect layer;

the portions of the upper and lower plates which directly contact the conductors forming plate barrier layers to prevent atom diffusion or ion migration from the conductors at those direct contact locations; and the conductor of the upper interconnect layer includes a plurality of finger portions which project into a plurality of the U-shaped portions of the upper plate.

2. An IC as defined in claim 1 wherein the conductors are substantially copper.

3. An IC as defined in claim 1 further comprising:

additional barrier layers contacting the conductors at locations other than at the contact locations of the upper and lower plates to prevent atom diffusion or ion migration from the conductors at the other locations; and the plate barrier layers and the additional barrier layers encapsulate the conductors to prevent atom diffusion or ion migration.

4. An IC as defined in claim 3 wherein the additional barrier layers contacting the conductors are formed of the same material as the material from which at least one of the plates is formed.

5. An IC as defined in claim 3 further comprising:

a via plug interconnection extending between conductors of the upper and lower interconnect layers, the via plug interconnection including plug material formed of a metal capable of atom diffusion or ion migration; and a plug barrier layer surrounding the plug material.

6. An IC as defined in claim 1 wherein the U-shaped portions of the upper plate surround the finger portions to form a barrier to prevent atom diffusion or ion migration from the finger portions.

7. An IC as defined in claim 1 further comprising:

a via plug interconnection extending between conductors of the upper and lower interconnect layer, the via plug interconnection including plug material formed of a metal capable of atom diffusion or ion migration; and a plug barrier layer surrounding the plug material.

8. In an integrated circuit (IC) having upper interconnect layer and a lower interconnect layer in which each interconnect layer comprises a conductor formed of a metal capable of atom diffusion or ion migration, an improved capacitor located between the upper and lower interconnect layers comprising:

upper and lower capacitor plates;

capacitor dielectric material separating the plates;

the upper plate includes a plurality of U-shaped portions;

the lower plate includes a plurality of U-shaped portions which extend generally parallel to the U-shaped portions of the upper plate;

each U-shaped portion includes a pair of leg portions connected at a base portion;

the base portion of the lower plate directly contacting a conductor positioned within the lower interconnect layer;

the upper plate having a portion directly contacting a conductor positioned within the upper interconnect layer;

the portions of the upper and lower plates which directly contact the conductors forming plate barrier layers to prevent atom diffusion or ion migration the conductors at those direct contact locations;

a via plug interconnection extending between conductors of the upper and lower interconnect layers, the via plug interconnection including plug material formed of a metal capable of atom diffusion or ion migration;

a plug barrier layer surrounding the plug material; and the plug material and the conductors are of substantially the same metal.

9. An IC as defined in claim 8 wherein the plug barrier layer and one of the plates of the capacitor are of substantially the same material.

10. An IC as defined in claim 9 wherein the plug barrier layer and one of the plates of the capacitor are integrally, connected.

11. An IC as defined in claim 10 wherein:

the metal of the conductors and the plug material is substantially copper; and the material of the plug barrier layers and material of the capacitor plates include a metal selected from the group consisting of tantalum, tantalum nitride, titanium nitride, and molybdenum.

12. An IC as defined in claim 8 wherein:

the conductor of the upper interconnect layer includes at least one finger portion which projects into one of the U-shaped portions of the upper plate.

13. In an integrated circuit (IC) having upper interconnect layer and a lower interconnect layer in which each interconnect layer comprises a conductor formed of a metal capable of atom diffusion or ion migration, an improved capacitor located between the upper and lower interconnect layers comprising:

upper and lower capacitor plates;

capacitor dielectric material separating the plates;

the upper plate includes a plurality of U-shaped portions;

the lower plate includes a plurality of U-shaped portions which extend generally parallel to the U-shaped portions of the upper plate;

each U-shaped portion includes a pair of leg portions connected at a base portion;

the conductor of the upper interconnect layer includes at least one finger portion which projects into one of the U-shaped portions of the upper plate;

the base portion of the lower plate contacting a conductor positioned within the lower interconnect layer;

the upper plate having a portion contacting a conductor positioned within the upper interconnect layer; and the portions of the upper and lower plates which contact the conductors forming plate barrier layers to prevent atom diffusion or ion migration from the conductors at the contact locations.

14. An IC as defined in claim 13 wherein one of the U-shaped portions of the upper plate surrounds the finger portion of the conductor and forms the barrier layer to prevent atom diffusion or ion migration from the finger portion.

15. An IC as defined in claim 13 wherein:

the interconnect layers extend substantially horizontally and are vertically spaced with respect to one another; and the leg portions of the U-shaped portions extend substantially vertically between the interconnect layers.

16. An IC as defined in claim 15 further comprising:

interlayer dielectric material separating the vertically spaced interconnect layers; and wherein:

the capacitor is located substantially in the interlayer dielectric material.

17. In an integrated circuit (IC) having upper interconnect layer and a lower interconnect layer in which each interconnect layer comprises a conductor formed of a metal capable of atom diffusion or ion migration, an improved capacitor located between the upper and lower interconnect layers comprising:

upper and lower capacitor plates;

capacitor dielectric material separating the plates;

the upper plate includes a plurality of U-shaped portions;

the lower plate includes a plurality of U-shaped portions which extend generally parallel to the U-shaped portions of the upper plate;

each U-shaped portion includes a pair of leg portions connected at a base portion;

the U-shaped portions are horizontally separated in the upper and lower plates by spaces;

the conductor of the upper interconnect layer includes a finger portion which projects into the U-shaped portion of the upper plate the conductor of the upper interconnect layer includes at least one additional finger portion which projects into the space between the U-shaped portions of the lower plate;

the base portion of the lower plate having a portion contacting a conductor positioned within the lower interconnect layer to form a plate barrier layer to prevent atom diffusion or ion migration from the conductor at that contact location;

the upper plate having a portion contacting a conductor positioned within the upper interconnect layer to form a plate barrier layer to prevent atom diffusion or ion migration from the conductor at that contact location;

additional barrier layers contacting each finger portion to prevent atom diffusion or ion migration from the conductors at the locations of each finger portion; and the plate barrier layers and the additional barrier layers encapsulate the conductors to prevent atom diffusion or ion migration.

18. An IC as defined in claim 17 wherein:

the additional barrier layers which contact the finger portions constitute an extension of the plate barrier layer of at least one of the upper or lower plates.

19. An IC as defined in claim 18 wherein:

all of the U-shaped portions of the lower plate are commonly connected to a single segment of the conductor of the lower interconnect layer.

20. An IC as defined in claim 17 further comprising:

a via plug interconnection extending between conductors of the upper and relatively lower interconnect layers, the via plug interconnection including plug material formed of a metal capable of atom diffusion or ion migration;

a plug barrier layer surrounding the plug material; and wherein:

the plug material and the conductors are of substantially the same metal; and the plug barrier layer and one of the plates of the capacitor are of substantially the same material.

* * * * *